United States Patent [19]

Alexander et al.

[11] 4,353,787

[45] Oct. 12, 1982

[54] PHOTO CURABLE POLYESTER WITH BENZOYL OXIME CARBONATE, PHOTO REDUCIBLE DYE (EOSIN), AND A BENZYL AMINE

[75] Inventors: Ian J. Alexander; Roger J. Scott, both of Wellingborough, England

[73] Assignee: Scott Bader Company Limited, Northamptonshire, England

[21] Appl. No.: 265,916

[22] Filed: May 21, 1981

Related U.S. Application Data

[63] Continuation of Ser. No. 107,779, Dec. 28, 1979, abandoned.

[30] Foreign Application Priority Data

Jan. 11, 1979 [GB] United Kingdom ............... 7901117

[51] Int. Cl.³ .................... C08F 2/46; C08L 67/06
[52] U.S. Cl. ...................... 204/159.15; 204/159.18; 204/159.23; 204/159.24; 430/285; 430/339; 430/915; 430/919; 525/21; 525/25; 524/110; 524/240
[58] Field of Search .............. 204/159.15, 159.19, 204/159.23, 159.24; 430/339, 285, 915, 919; 525/21; 260/40 R

[56] References Cited

FOREIGN PATENT DOCUMENTS 1408265 10/1975 United Kingdom .
1537921 1/1979 United Kingdom .

OTHER PUBLICATIONS

Delzenne, et al., "Photopolymerization of Acrylamide . . . ", Journal of Polymer Science, 58, pp. 347-355 (1960).
Toppet et al., "Photosensitized Polymerization of Acrylic . . . ", Journal of Polymer Science, A2, pp. 1539-1548 (1964).

Primary Examiner—Wilbert J. Briggs, Sr.
Assistant Examiner—A. H. Koeckert
Attorney, Agent, or Firm—Pearne, Gordon, Sessions, McCoy & Granger

[57] ABSTRACT

A photo-initiator system of a polyester resin is disclosed which consists of an oxime carbonate of a vicinal diketone (I), a photo-reducible dye (II) and an amine (III). This system is capable of polymerizing and curing unsaturated polyester resins by irradiation with visible light to provide coatings, adhesives, castings and fibre reinforced composites.

The formulae of the ingredients of the system are

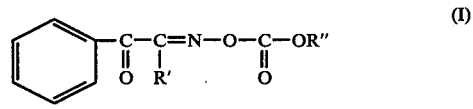

where R' and R" are independently alkyl, aryl or aralkyl (R' preferably being $CH_3$ and R" $C_2H_5$)

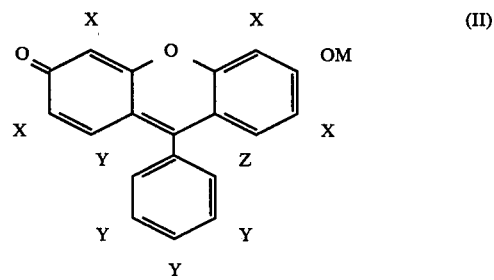

wherein
X=Br or I on at least 2 positions
Y=H, Br, I
Z=H, COOM, COOR wherein R=$C_1$-$C_5$ alyl.
M=H, K, Na, Li, $NH_4$ (there preferably being 4X substituents which are Br, and Z preferably being —COOM or —COOR), and wherein also 4Y substituents may be present and preferably be I) and (III)

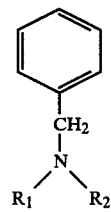

wherein $R_1$ is H, alkyl, hydroxy-substituted alkyl, aryl or aralkyl. $R_2$ is independently alkyl, hydroxyl substituted alkyl, aryl or aralkyl. The alkyl groups are preferably $C_1$-$C_5$, the aryl group phenyl and the aralkyl benzyl (preferred such compounds being tribenylamine and dibenzylethanolamine).

21 Claims, No Drawings

PHOTO CURABLE POLYESTER WITH BENZOYL OXIME CARBONATE, PHOTO REDUCIBLE DYE (EOSIN), AND A BENZYL AMINE

This is a continuation of application Ser. No. 107,779, filed Dec. 28, 1979, now abandoned.

FIELD OF THE INVENTION

This invention relates to the polymerisation and curing of unsaturated resinous compositions by irradiating the composition with visible light.

BACKGROUND OF THE INVENTION

It is known that unsaturated resins capable of free-radical polymerisation can be cured by the addition of photoinitiators and exposure to ultra-violet (UV) or visible radiation. The use of UV radiation in particular is very well established in the curing of thin films of resin used as surface coatings and inks. However UV curing is not suitable for thick coatings, or for glass-reinforced resins due to the poor penetration of the UV radiation which is strongly absorbed by the resin and the glass reinforcement if used. This means that cure is incomplete or takes an unacceptably long time to complete. Furthermore UV radiation is very dangerous to the eyes and skin and it is therefore necessary to use elaborate shielding and safety devices in order to safeguard the health of operatives. Such devices add considerably to the cost and inconvenience of the use of UV radiation.

In contrast visible light has none of these disadvantages. Furthermore it is readily available as natural sunlight, from tungsten filament bulbs, fluorescent tubes and so on, and is not harmful to the eyes or skin under normal conditions.

Systems for curing of resins with visible light have been described but have a number of disadvantages. For example, the components of some systems are extremely toxic or expensive, or show insufficient sensitivity to normal visible light and therefore require special and expensive light sources to perform satisfactorily.

It is already known that eosin plus a suitable reducing agent, such as ascorbic acid, can act as photoinitiator for the polymerisation of monomers in aqueous solutions in which water is part of the reaction chain. For example this system can be used to polymerise acrylamide (see G. Delzenne, S. Toppet, G. Smets J.Polymer Sci., 68; 347 (1960) and Ibid. Part A Vol. 2 1539 (1964)), in aqueous solution.

It has been previously suggested that a ketonic photosensitizer, especially α-diketones, plus a reducing agent capable of acting on the photosensitizer when the latter is in an excited state could be used for the curing of unsaturated polyester resins, (see GB PS No. 1,408,265). The reducing agent could in general be a tertiary amine. In a comparative example this patent discloses the use of rose bengal (tetrachlorotetraiodofluorescein, a polyhalogenated fluorescein) as photosensitizer, with unfavourable results. It is stated that if a pigment is present it must be absorbent of light wavelenghts different from those which excite the photosensitizer.

Benzoyl substituted-oxime carbonate esters (BOCE) have been claimed as potent U.V. photo initiators requiring low irradiation doses for curing resins (B.P. No. 1,537,921). However they are poor initiators when incorporated into unsaturated polyester resins and irradiated with visible light.

SUMMARY OF THE INVENTION

We have now discovered that compounds of this type, when used with certain photo-reducible dyes and a reducing agent capable of reducing the dye when it is in a photo-excited stated, can be used to cure unsaturated polyester resins by irradiation with visible light.

The visible light curing systems of this invention must include

A. An unsaturated polyester

B. A BOCE of the general formula I as photo initiator

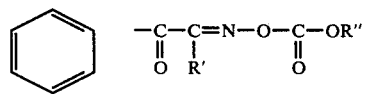

where R′,R″ are alkyl, aryl or aralkyl

One commercially available such BOCE is Quantacure ® PDO wherein R′ is —CH₃ and R″ is —C₂H₅, made by Ward Blenkinsop & Co. Ltd., Empire Way, Wembley, Middlesex.

C. A photo-reducible dye which is capable of absorbing electromagnetic radiation in the visible region i.e. about 400 nm to 800 nm wavelength, which raises it to an excited state in which it is capable of reacting with a suitable reducing agent. Especially suitable dyes are eosins of the general formula II.

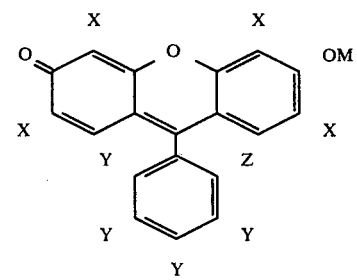

wherein

X=Br or I on at least 2 positions

Y=H, Br, I

Z=H, COOM, COOR wherein R=$C_1$-$C_5$ alkyl.

M=H, K, Na, Li, $NH_4$ or a mixture of such dyes.

D. A reducing agent which is an amine of the general formula III.

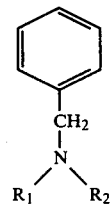

wherein $R_1$ is H, alkyl, hydroxy-substituted alkyl, aryl or aralkyl. $R_2$ is independently alkyl, hydroxyl substituted alkyl, aryl or aralkyl. The alkyl groups are preferably $C_1$–$C_5$, the aryl group phenyl and the aralkyl benzyl.

Preferably the concentration of the photo-initiator (B) is in the range 0.01–1.0% weight, more preferably 0.02–0.5% by weight and most preferably 0.05–0.2% by weight. This contrasts with the concentrations necessary when U.V. curing is envisaged which are 0.5–15% by weight.

Preferred compounds of the formula II are those in which each X is Br or I and Z is COOM or COOR.

An overlapping preferred group of compounds of the formula II is that in which each X is Br or I and each Y is I.

The dye (C) is normally used at a concentration of 100–5000 ppm or more advantageously 150–2000 ppm or preferably 200–1000 ppm. Commercially available dyes of this type are frequently mixtures of closely related compounds and are used within the invention.

The amine (D) can be present in the range 0.1–10% by weight but it is preferable to use less than 5% by weight of the total composition.

The unsaturated polyesters in this invention are those formed by the reaction of an $\alpha\beta$ unsaturated dibasic acid or anhydride (with or without the presence of a saturated dibasic acid or anhydride) and one or more glycols. The resulting condensation product is dissolved in a vinyl type monomer.

Typical examples of the basic starting materials for such polyesters are:

(i) Unsaturated dibasic acids/anhydrides-maleic anhydride, fumaric acid.

(ii) Saturated dibasic acids/anhydride-phthalic anhydride, isophthalic acid, terephthalic acid, endomethylene tetrahydrophthalic anhydride, tetrahydrophthalic anhydride, adipic acid, sebacic acid, tetrachlorophthalic anhydride, tetrabromophthalic anhydride, chlorendic acid or anhydride (iii) Glycols-ethylene glycol, 1.2 propanediol, 1.3 propanediol, diethylene glycol, dipropylene glycol, neopentyl glycol, dibromonepentyl glycol, glycols made from the reaction of alkylene oxides and bisphenol A.

(iv) Monomers 1 styrene, vinyl toluene, methyl methacrylate, bromostyrene, ethylene glycol dimethacrylate, $\beta$ hydroxyethyl acrylate.

The ingredients BC and D are added in any desired order to form the resin composition which is sent out as a complete system.

These resins can be admixed either in the factory or on site with conventional materials such as fillers, thixotropes, fire retardants and pigments to form gelcoats and/or with glass or other fibres such as carbon or Kevlar ® to yield high-strength composite material by the usual laminating techniques.

The light source used for curing the resin system of this invention may be any source of visible light, of which the most economical are natural sunlight, tungsten filament lamps and fluorescent tubes.

When exposed to such a source polymerization and cure is induced in the resin which will simultaneously fade in colour so that the final colour of the resin is unobjectionably pale. This can serve also as an indication of the progress of the reaction.

DESCRIPTION OF PREFERRED EMBODIMENTS

Example 1

To 100 grams of Crystic ®196, (an unsaturated polyester resin sold by Scott Bader Company Limited, of acid value 22.0 mgKOH/g and containing 35% styrene monomer), were added 30 milligrams of eosin Y (Eastman Kodak), 2.5 grams of tribenzylamine and 0.10 grams of Quantacure PDO (ex Ward Blenkinsop and Company Limited). Slight warming was necessary to dissolve the tribenzylamine but finally a clear pink-orange coloured resin was obtained. Part of the resin was poured into a mould fabricated from two sheets of plate glass each 92 mm×154 mm separated by a U-shaped stainless steel divider 6 mm thick. The filled mould was then placed six feet from a bank of sixteen 150 watt tungsten-filament spot/food lamps which produced an even light intensity at the mould surface. Gelation of the resin was observed after 35 minutes irradiation, and after 50 minutes a strong exotherm was detected. After one hour the lights were extinguished and when the cured resin had cooled it was separated from the mould. The colour of the resin had faded to a straw colour. Samples were cut from the moulded sheet and their heat deflection temperature measured according to British Standard No. 2782:102G. The average heat deflection temperature was 81° C. The standard heat deflection temperature for Crystic 196 cured with methyl ethyl ketone peroxide and cobalt octoate is 72° C. after post curing at 80° C. for 3 hours.

Example 2

The conditions of Example 1 were repeated except only four 150 watt tungsten filament spot/flood lamps were used. Gelation of the resin started in 80 minutes and an exotherm was noted after 100 minutes. After two hours the lights were extinguished and the sample was left in the dark for 16 hours. The sample was then irradiated under the same conditions for a further 2 hours. The cast sheet obtained recorded a heat deflection temperature of 79° C.

Example 3

A sample of Crystic ®272 an isophthalic acid based polyester made by Scott Bader Company Limited was made up to the formulation given in Example 1 and used to fabricate a glass fibre reinforced laminate containing four layers of 450 g/m² powder bound chopped strand glass mat at a resin:glass ratio of 2.3:1. The laminate was cured by visible light irradiation provided by sixteen 150 watt spot/flood lamps. Irradiation was continued for 2 hours after which the laminate was placed in an oven at 40° C. for 16 hours. Samples were cut from the laminate and tested in tension according to ISO 3268. The results are shown below in comparison with a laminate made using Crystic 272 cured by MEK peroxide and cobalt and also post cured at 40° C.

| | Photo-cured Laminates | Peroxide-cured Laminates (comparative) |
|---|---|---|
| Barcol Hardness | | |
| Air surface | 35 | ND |
| Mould surface | 50 | ND |
| Tensile Break Load/mm width (MN/mm) | 444 ± 17.6 | 415 ± 13.7 |
| Tensile Strength | | |

|  | Photo-cured Laminates | Peroxide-cured Laminates (comparative) |
|---|---|---|
| (MPa) | 125 ± 7.6 | 104 ± 5.7 |
| Tensile Stiffness (MN/mm) | 28150 ± 906 | 29370 ± 1853 |
| Tensile Modulus (GPa) | 7.9 ± 0.4 | 7.4 ± 0.6 |
| Elongation to Break (%) | 1.99 | 1.80 ± 0.11 |

ND = not determined

Example 4

2.5 Parts by weight (p.b.w.) of tribenzylamine were dissolved in 97.36 p.b.w. of Crystic®272 (an isophthalic based polyester resin ex Scott Bader Company Limited). Also added were 0.10 p.b.w. of Quantacure® PDO (Ward-Blenkinsop and Company Limited), 0.02 p.b.w. of eosin Y (the disodium salt of tetrabromofluorescein i.e. each X is Br, Z is COOH and M is Na) and 0.02 p.b.w. of spiritlsoluble eosin (the sodium or potassium salt of the ethyl ester of tetrabromofluorescein) (both products of Eastman Kodak Company) to obtain a clear orange-red resin. 10 grams of the resin were poured into a shallow aluminium-foil mould, the top surface being left open to the air. The mould was irradiated with visible light from a household tungsten filament bulb. The resin gelled in five minutes. After one hour the cured resin had a hardness of Barcol 30 on the top (air) surface and of Barcol 40 on the lower (mould) surface. The colour of the resin had bleached to a pale straw colour.

Example 5

(a) Comparative

Eosin (spirit soluble, ex BDH 0.06 parts by weight) and tribenzylamine (2.5 parts by weight) were admixed with 97.5 parts by weight of Crystic®196 (a general purpose orthophthalic-based polyester resin ex Scott Bader Company Limited) and the resin poured into a mould and irradiated as in Example 4 but at a light intensity 3/5 of that used in Example 4. Although the resin gelled in less than 10 minutes and the colour of the dye faded cure was incomplete as indicated by a zero Barcol hardness and poor mechanical properties of the product.

(b) When this experiment was repeated with the addition of 0.5 parts by weight of Quantacure®PDO the resin gelled within less than 3 minutes and reached a Barcol hardness of 40 in 2 hours of irradiation.

Example 6

A sample of Crystic®196 was supplemented to the formulation given in Example 1 and used to fabricate a glass fibre reinforced laminate containing twelve layers of 450 g/m² powder bound chopped strand mat at a resin to glass ratio of 2.3:1. The laminate was cured by visible light irradiation provided by sixteen 150 watt spot/flood lamps giving a light intensity at the laminate surface half that used in Example 4. Irradiation was continued for two hours after which the laminate was placed in an oven at 40° C. for 16 hours.

Samples cut from the laminate had the following mechanical properties.

| Sample thickness | 11.37 ± 0.60mm |
|---|---|
| Tensile strength (MPa) | 103 ± 6 |
| Tensile modulus (GPa) | 9.1 ± 0.5 |
| Tensile elongation (%) | 1.63 ± 0.20 |
| Single lap shear strength (MPa) | 9.7 ± 0.8 |
| Bend strength (MPa) | 177 ± 14 |
| Bend modulus (GPa) | 8.0 ± 0.3 |

Example 7

Cast sheets were prepared for determination of heat deflection temperatures and mechanical properties by preparing resins of the following formulations.

| Crystic 196 or Crystic 272 | 97.2 p.b.w. |
|---|---|
| Tribenzylamine | 2.5 p.b.w. |
| Quantacure PDO | 0.25 p.b.w. |
| Eosin Y | 0.04 p.b.w. |

Moulds, as described in example 1 were used to prepare samples for the determination of heat deflection temperatures, but 3 mm thick rubber separators were used between the glass plates of the moulds to prepare samples for the determination of mechanical properties. The mouldings were cured by irradiation with visible light from a bank of sixteen 150 watt spot/flood tungsten filament lamps two feet from the moulds. The resins gelled in less than four minutes but during subsequent cure the high temperatures developed by the exothermic polymerisation reactions caused many of the moulds and mouldings to crack. The light intensity was therefore reduced by reducing the voltages applied to the lamps from 240 volts to 210 volts. Uncracked samples were then obtained. The following results were obtained from specimens cut from the cast sheets.

|  | Crystic 196 |  | Crystic 272 |  |
|---|---|---|---|---|
| Hardness (Barcol tester) | 39 | (42) | 42 | (45) |
| Heat deflection temperature (°C.) | 86.5 | (78) | 90 | (75–80) |
| Tensile strength (MPa) | 85.4 ± 4.7 | (73) | 57 ± 5.8 | (65–75) |
| Elongation (%) | 3.1 ± 0.5 | (4.1) | 1.5 ± 0.1 | (2.0–2.5) |
| Initial tensile modulus (GPa) | 4.03 | (2.95) | 4.47 | (3.5–4.5) |
| Water absorption (mg %) (24 hours at room temperature) | 16.5 | (<20) | 17.1 | (<20) |

Figures in parentheses indicates typical values obtained for the same resins cured with methyl ethyl ketone peroxide and cobalt octoate and post cured at 80° C. (Heat deflection temperature samples received further post cure at 120° C.).

Example 8

A photocuring formulation based on Crystic 196 was prepared containing 0.1% Quantacure PDO, 0.04% Eosin Y and 2.5% tribenzylamine and used to impregnate two layers of Kevlar®49 polyaramide fibre woven roving (Kevlar is a registered trademark of DuPont Limited) to give a laminate with a nominal resin content of 80% by weight.

When exposed to visible light from tungsten-filament lamps with an intensity equal to that used in Example 4 the resin gelled in twelve minutes, bleached in twenty minutes, exothermed noticeably after 30 minutes and was fully cured in an hour.

Example 9

An unsaturated polyester resin equivalent to Crystic 196 but in which the styrene was replaced by an equal weight of β hydroxyethyl acrylate was formulated with 0.1% Quantacure PDO, 0.01% Eosin Y, 0.03% eosin-spirit soluble, and 2.5% tribenzylamine. 10 Grams of the formulated resin were poured into a circular shallow aluminium foil mould and irradiated with visible light with an intensity equal to that used in Example 4. The sample gelled in less than 3.5 minutes and bleached in 13 minutes to produce a hard, water-white casting with a perfectly dry air-surface.

Example 10

A photocurable resin was formulated as follows:

| | |
|---|---|
| Crystic ® 272 | 97.2 p.b.w. (parts by weight) |
| Tribenzylamine | 2.500 p.b.w. |
| Quantacure PDO | 0.25 |
| Wax | 0.020 |
| Spirit soluble eosin or potassium (sodium/salt of ethyl ester of eosin) | 0.015 |
| Eosin Y (disodium salt of eosin) | 0.015 |
| | 100.000 |

This resin was used to prepare a filament-wound glass-fibre reinforced pipe by means of a laboratory filament-winding machine in which twenty glass-fibre rovings were led through a shallow tray containing the resin, so as to coat the glass with resin, and then between two rollers which removed excess resin before the resin-coated glass fibre rovings were wound round a rotating stainless steel mandrel. The mandrel was irradiated with the light from two fifteen hundred watt tungsten-halogen floodlamps each about one meter from the mandrel. After twenty five minutes the winding of additional glass fibre rovings was stopped but irradiation and rotation of the mandrel was maintained. After forty five minutes rapid bleaching of the resin was observed and after a total time of seventy minutes the mandrel was stopped and the filament-wound glass fibre reinforced polyester pipe produced was released.

This pipe was approximately one meter long, 30 mm in internal diameter and 6.5 mm thick. It had a Barcol hardness of fifty and its colour was reduced to a pale straw.

Example 11

A series of photocuring resins was prepared in duplicate using the following formulation:

| | |
|---|---|
| Crystic ® 600 (an unsaturated polyester based on propoxylated bisphenol A and maleic anhydride) | 97.35 p.b.w. |
| Tribenzylamine | 2.50 |
| Quantacure PDO | 0.10 |
| Dye | 0.05 |

The dyes used and the average results obtained from the duplicate samples are shown in Table 1. 10 grams of each sample was poured into a shallow aluminium foild mould and exposed to light intensity from tungsten filament lamps equal to that used in Example 4. The final colour in each case was pale straw.

TABLE 1

| Dye | Initial Colour of Resin | Gel Time (minutes) | Bleach Time (minutes) | Barcol Hardness 60 mins | Barcol Hardness 120 mins |
|---|---|---|---|---|---|
| Eosin-spirit soluble (1) | Orange | 10–12 | 15–20 | 35 | |
| Erytheosin B (2) | Orange/red | 8–10 | 10–15 | 35 | |
| Rose Bengal (3) | Crimson | 12–14 | 14–20 | 35 | |
| Dibromo-fluorescein (4) | Yellow | 40–45 | ca 60 | 0 | 35 |
| Rhodamine B (5) | Crimson | 40–45 | 240 | 0 | 0 |

Notes: According to formula II;
(1) each X = Br, each Y = H, M = Na and Z = CO.OEt
(2) each X = I, each Y = H, M = Na and Z = CO.ONa
(3) each X = I, each Y = Cl, M = Na and Z = CO.ONa
(4) two X's = Br, two X's = H, each Y = H, M = Na, Z = CO.ONa
(5) Rhodamine B has the formula:-

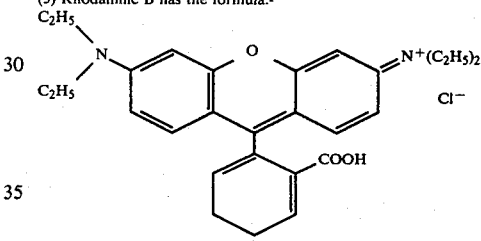

This shows that Rhodamine B, a dye of similar chemical structures to those of formula II but containing no halogen atoms is not effective in the claimed system.

Example 12

A series of photocuring resins was prepared in duplicate according to the following formulation:

| | |
|---|---|
| Crystic ® 198 (an unsaturated polyester resin ex Scott Bader Co. Ltd) | 97.26 p.b.w. |
| Amine (see Table 2) | 2.50 |
| Quantacure PDO | 0.20 |
| Eosin-spirit soluble | 0.03 |
| Eosin Y | 0.01 |

10 Grams of each sample was poured into a shallow aluminium foil mould and exposed for 60 minutes to visible light with an intensity equal to that used in Example 4 provided by tungsten filament lamps. The results of this experiment are given in Table 2.

TABLE 2

| Amine | Gel Time (Minutes) | Bleach Time (Minutes) | Comments |
|---|---|---|---|
| N,N—Dibenzylethanolamine | 4 | 6 | Well cured, no air surface tack |
| N—Benzyldiethanolamine | 8½ | 18 | Well cured, slight air surface tack |
| N—benzyl-N—methylethanol amine | 8½ | 16½ | Well cured, no air surface tack |
| N,N,—dimethylbenzylamine | 21 | 28 | Well cured, slight air surface tack |
| Tribenzylamine | 3 | 7 | Well cured, slight air surface tack |

TABLE 2-continued

| Amine | Gel Time (Minutes) | Bleach Time (Minutes) | Comments |
|---|---|---|---|
| Dibenzylamine | 23 | 32½ | Well cured, slight air surface tack |
| N—Ethylmorpholine | 19 | 28+ | Incomplete bleaching, air surface tacky |

These results show that N ethylmorpholine, often used as a reducing agent in photocure systems, is much less effective than the claimed system.

Example 13

A photocuring white gelcoat was prepared by adding 7½% by weight white pigment paste to a sample of gelcoat 65 (Scott Bader Co. Ltd) containing 0.1% Quantacure PDO, 2.5% Tribenzylamine and 0.05% eosin-spirit soluble.

A female mould of a model boat hull approximately 4 ft×1 ft×9 ins was treated with a suitable mould release agent before the white gelcoat was brushed onto it to provide a coating approximately twenty thousandths of an inch thick. The mould was irradiated by light from two 1500 watt tungsten-halogen floodlamps at a distance of one meter. The pink colour of the gelcoat bleached white in less than three minutes and it was possible to lay-up a glass fibre laminate on the gelcoat within ten minutes without the glass fibres penetrating the gelcoat. After curing the laminate it was possible to release the moulding from the mould without difficulty. The gelcoat was fully cured and showed no residual colour due to the dye.

Example 14

Ten grams of a fire retardant unsaturated polyester resin based on dibromoneopentyl glycol and containing tris (chloroethyl) phosphate (fire retardant additive), Quantacure PDO (0.2%), eosin-spirit soluble (0.03%), Eosin Y (0.01%) and tribenzylamine (2.5%) was poured into a shallow aluminium foil mould and irradiated with visible light from a tungsten filament bulb. The resin gelled in three minutes, fully bleached in 11 minutes and after 60 minutes had a Barcol hardness of 30.

Crystic ®386 a clear fire retardant resin (i.e. passing B.S.476 part VII, Glass I) based on maleic and chlorendic acid anhydrides and containing proprietory fire retardant additives was formulated with Quantacure PDO (0.1%) eosin-spirit soluble (0.04%) and tribenzylamine (2.5%). 10 grams of this formulated resin was poured into a shallow aluminium foil mould and irradiated with visible light with an intensity 1.5 times that used in Example 4. The resin gelled in less than one minute, bleached in two minutes and had an average Barcol hardness of 30 after one hour.

We claim:

1. A visible-light curable unsaturated polyester resin composition comprising
   (a) at least one benzoyl oxime carbonate ester of the formula

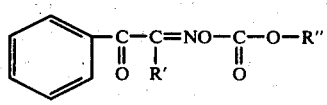

wherein R' and R" are members of the group consisting of alkyl, aryl and aralkyl; and
   (b) at least one photo-reducible dye; and
   (c) at least one N,N-disubstituted benzylamine reducing agent.

2. A resin as claimed in claim 1, wherein said at least one photo-reducible dye is capable of absorbing electromagnetic radiation in the visible region to raise it to an excited state for reaction with said at least one reducing agent.

3. A resin as claimed in claim 1, wherein said at least one photo-reducible dye is capable of absorbing electromagnetic radiation having a wavelength from about 400 nm to about 800 nm.

4. A resin as claimed in claim 1, 2, or 3, wherein said at least one photo-reducible dye is polyhalogenated.

5. A resin as claimed in claim 1, wherein said at least one photo-reducible dye is an eosin dye.

6. A visible-light curable unsaturated polyester resin composition comprising
   (a) at least one benzoyl oxime carbonate ester of the formula

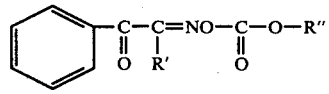

wherein R' and R" are members of the group consisting of alkyl, aryl and aralkyl; and
   (b) at least one photo-reducible dye of the formula

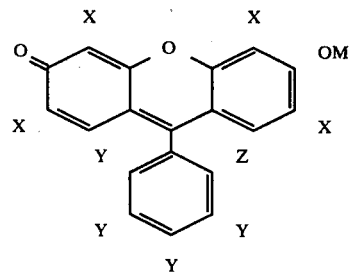

wherein X is a member of the group consisting of Br and I and is present on at least 2 said positions, Y is a member of the group consisting of H, Br, Cl and I, Z is a member of the group consisting of H, COOM and COOR wherein R is a member of the group consisting of $C_1, C_2, C_3, C_4$ and $C_5$ alkyl, and M is a member of the group consisting of H, K, Na, Li and $NH_4$ and
   (c) at least one reducing agent of the formula

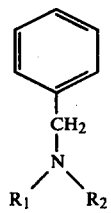

wherein $R_1$ is a member of the group consisting of H, alkyl, hydroxy-substituted alkyl, aryl and aralkyl and $R_2$ is a member of the group consisting of alkyl, hydroxy-substituted alkyl, aryl and aralkyl.

7. A resin as claimed in claim 6, wherein in the ingredient (b) each Y is Cl and there are four said Y substituents.

8. A resin as claimed in claim 6, wherein the ingredient (b) is rose bengal dye.

9. A visible-light curable unsaturated polyester resin composition comprising
(a) at least one benzoyl oxime carbonate ester of the formula

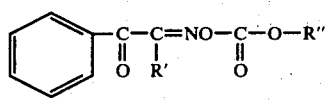

wherein R' and R" are members of the group consisting of alkyl, aryl and aralkyl; and
(b) at least one photo-reducible dye of the formula

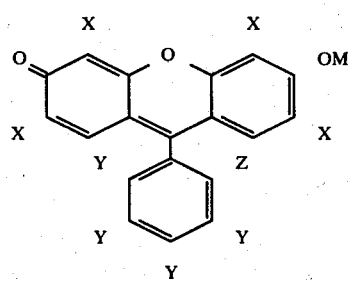

wherein X is a member of the group consisting of Br and I and is present on at least 2 said positions Y is a member of the group consisting of H,Br and I Z is a member of the group consisting of H, COOM and COOR wherein R is a member of the group consisting of $C_1,C_2,C_3,C_4$ and $C_5$ alkyl and M is a member of the group consisting of H,K,Na,Li and $NH_4$ and
(c) at least one reducing agent of the formula

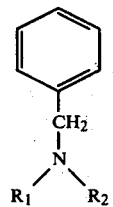

wherein $R_1$ is a member of the group consisting of H, alkyl, hydroxy-substituted alkyl, aryl and aralkyl and $R_2$ is a member of the group consisting of alkyl, hydroxy-substituted alkyl, aryl and aralkyl.

10. A resin as claimed in claim 9 wherein in the ingredient (a) the group R' is —$CH_3$ and the group R" is —$C_2H_5$.

11. A resin as claimed in claim 9 wherein in the ingredient (b) each X present is Br and Z is a member of the group consisting of —COOM and —COOR.

12. A resin as claimed in claim 11 wherein there are four said X substituents present.

13. A resin as claimed in claim 9 wherein the ingredient (c) is a tertiary amine in the group consisting of tribenzylamine and N,N-dibenzylethanolamine.

14. A resin as claimed in claim 11 wherein in the ingredient (b) each Y is a member of the group consisting of Br and I and there are four said Y substituents.

15. A resin as claimed in claim 9 wherein the ingredient (a) is present in the amount of about 0.01% to about 1.0% by weight of the resin.

16. A resin as claimed in claim 15 wherein the said amount is 0.05% to 0.2% by weight.

17. A resin as claimed in claim 9 wherein the ingredient (b) is present in an amount of about 150 to about 2000 ppm of the resin.

18. A visible-light curable composition comprising
(a) an unsaturated polyester and
(b) about 0.01% to about 1% by weight of at least one benzoyl oxime carbonate ester of the formula

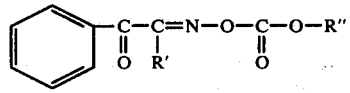

wherein R' and R" are members of the group consisting of alkyl, aryl and aralkyl; and
(c) about 100 to about 5000 ppm by weight of at least one photo-reducible dye of the formula

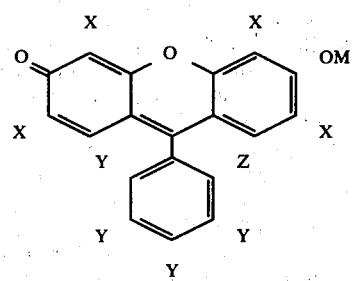

wherein
X is Br and is present in all four said positions
Y is a member of the group consisting of H,I and Br and
Z is a member of the group consisting of —COOM and —COOR wherein M is a member of the group consisting of K and Na and R is a member of the group consisting of methyl and ethyl; and
(d) about 0.1% to about 10% by weight of a N,N-disubstituted benzylamine wherein each substituent is a member of the group consisting of $C_{1-5}$ alkyl, $C_{1-5}$ hydroxyalkyl, phenyl and benzyl.

19. A composition as claimed in claim 18 wherein; in the ingredient (b) R' is —$CH_3$ and R" is —$C_2H_5$ in the ingredient (c) Y is I and is present in all four said positions, —OM is a member of the group ONa or OK and Z is —COOR in the ingredient (d) at least one of the substituents is benzyl.

20. A process for the curing of an unsaturated polyester resin comprising subjecting to electromagnetic radiation in the visible range a resin comprising the ingredients (a) (b) and (c) defined in claim 9 for a period of time and at an intensity of radiation sufficient to cause gelation and cure of said resin.

21. A process as claimed in claim 20 wherein the resin is impregnating fibrous reinforcement, to produce a structurally composite product.

* * * * *